United States Patent [19]

Canavello et al.

[11] 4,259,369

[45] Mar. 31, 1981

[54] IMAGE HARDENING PROCESS

[75] Inventors: Benjamin J. Canavello, Stony Point; Michael Hatzakis, Chappaqua, both of N.Y.

[73] Assignee: International Business Machines Corporation, Armonk, N.Y.

[21] Appl. No.: 103,252

[22] Filed: Dec. 13, 1979

[51] Int. Cl.³ .................................................. B44D 1/46
[52] U.S. Cl. ..................................... 427/155; 427/99; 427/245; 430/330
[58] Field of Search .................. 427/154, 155, 245, 99; 430/330, 5, 939, 16, 29, 198, 644

[56] References Cited

U.S. PATENT DOCUMENTS

| | | | |
|---|---|---|---|
| 3,067,055 | 12/1962 | Saulnier | 427/69 |
| 3,402,073 | 9/1968 | Pierce et al. | 430/31 5 |
| 3,582,390 | 6/1971 | Saulnier | 427/69 |
| 3,920,483 | 11/1975 | Johnson et al. | 430/413 |
| 4,022,927 | 5/1977 | Pfeiffer | 430/330 |
| 4,125,650 | 11/1978 | Chiu et al. | 430/5 |
| 4,187,331 | 2/1980 | Ma | 430/330 |

*Primary Examiner*—Ralph S. Kendall
*Attorney, Agent, or Firm*—Hansel L. McGee

[57] ABSTRACT

Resist images are hardened so that they are flow resistant at elevated temperatures by coating the image with a layer of a porous metal or metal oxide.

11 Claims, No Drawings

IMAGE HARDENING PROCESS

BACKGROUND OF THE INVENTION

The formation of resist masks in the manufacture of integrated circuits using radiation sensitive layers which contain various organic polymers is known. Layers of the radiation sensitive material are formed on a substrate, exposed to light or other activating radiation such as electron beam or x-rays in a patternwise manner, and a visible image is developed by removing more soluble portions of the layer with a developing solution. In order to improve the characteristics of the remaining portions of the resist layer, such as its adhesion to various substrates, or its resistance to chemical and/or thermal degradation, the patterned resist layer is conventionally baked at an elevated temperature. The thermoplastic polymer materials in the resist are subject to flow at temperatures above their second order glass transition temperature. This tendency to flow distorts the resist image pattern, and in the fine geometry patterns which are required, for example, in integrated circuit manufacture the distortion can result in dimensional changes or even the closing of fine lines. Such distortion can also take place where the resist image is heated during the processing of the substrate such as by hot etchant solutions, ion implantation or plasma etching.

One solution to the problem has been the incorporation of free radical initiators into the resist structure such as is described in copending application Ser. No. 699,927 filed June 25, 1976 assigned a common assignee. While this produces resist masks having improved chemical and thermal stability, it does have the effect of lowering the sensitivity of the resist materials to radiation resulting in a need for longer exposure times.

U.S. Pat. No. 3,920,483 describes a resist hardening process used prior to ion implantation, in which the resist mask is subjected to an RF gas plasma oxidation to reduce the thickness of the photoresist layer and to limit resist flow during the ion implantation step.

U.S. Pat. No. 4,125,650, assigned to a common assignee, discloses a process for hardening resist masks, characterized by applying a coating of an agent comprising water soluble salts of orthoquinone diazide sulfonic and carboxylic acids. The resist mask coated with this agent is heated to cause the agent to form a hard crust or coating on the surface of said resist mask. However, since hardening of the resist is accomplished by a reaction of the coating agent with the resist components, the process is limited to resist systems that facilitate such reaction. The hardening process described herein can be used with any resist system that can be hardened by heating.

In addition, the process described in the above reference forms a hard continuous layer over the resist surface which prevents solvent evaporation from the resist during baking. This results in explosions, during baking, in large non-patterned areas of resist (larger than $100 \times 100\mu$).

An improved process has now been found for hardening resist images. It prevents image flow due to resist heating and maintains not only the image size in the resist but also the resist profile shape after prolonged heating at temperatures of about 230° C. or higher.

BRIEF SUMMARY OF THE INVENTION

In accordance with the invention the method is provided for forming a flow resistant mask on a substrate comprising evaporating a thin porous metallic layer on the exposed and developed photoresist image at pressures in the region of $10^{-1}$ torr. The metallic layer is caused to also cover the sidewalls of undercut resist regions.

DETAILED DESCRIPTION

The hardening agents for the practice of this invention include metals or insulators. Such agents include Al, $Al_2O_3$, Cr, Ag, Si, $SiO_2$, SiO and the like.

The hardener is formed on the resist mask by evaporating it in a poor vacuum. Evaporation is generally performed in a vacuum of from about $10^{-2}$ torr. to about 1 torr. Films of about 200 Å to about 1000 Å are deposited at these pressures. These resultant films are made porous so that under subsequent heat treatment the solvent in the resist material can escape without fracture or rupture of the film. The porous films can be subsequently removed by dipping them in an appropriate etching solution.

The resist compositions which are hardened by the technique of the invention can be either positive or negative acting resists. Negative resists are those which cross-link and become less soluble upon exposure to radiation. Example of negative resists are sensitized polyvinyl cinnamate polymer compositions such as are described in U.S. Pat. No. 2,732,301 and sensitized partially cyclized poly-cis-isoprene polymer compositions such as described in U.S. Pat. No. 2,852,379. Examples of positive resists which are degraded and become more soluble upon exposure to radiation are sensitized novolak resin compositions such as described for example in U.S. Pat. Nos. 3,046,118; 3,046,121; 3,201,239 and 3,666,743.

The above resists are only examples of positive or negative resists that can be hardened by the process described here, in fact any material or resist containing a thermoset resin that can be cross-linked by heating, can also be hardened with the process.

The resist layers are coated on a substrate and patternwise exposed to radiation after which the more soluble portions of the layer, which would be exposed portions on a positive resist and the unexposed portions on a negative resist, are removed with a developer solution. The resultant patterned resist mask is then ready for treatment in accordance with the process of this invention. A metal or insulator film is evaporated on to the surface of the resist image to form a porous coating or film thereon. After coating, the resist mask is heated at a temperature and for a time sufficient to evaporate the residue solvent in the resist film and cross-link the phenolic resin which comprises the main component of Diazo-type resists such as covered by the above mentioned disclosures. This heating process step completely hardens the resist film so that any subsequent heating will not cause any flow even in the absence of the porous surface layer. Typically heating is at a temperature of about 160° C. to about 240° C. The time of heating is from about 5 minutes to about 30 minutes.

After the baking step has been completed, the hardened film is placed in a buffered HF solution to etch the thin porous layer of aluminum. It is understood of course that other suitable etching solution will be used for the particular metal or insulator layer used.

The resultant resist mask exhibits substantially no lateral flow of the images during the baking step or during subsequent baking after removal of the porous layer. The image is protected at its sidewalls as well as at its undercuts. The hardened resist maintains its dimensional integrity during subsequent treatments of the exposed portions of the substrate such as etching with hot acids or with a reactive gas plasma, ion implantation or metal evaporation which cause the resist layer to be heated to elevated temperatures.

The invention is further illustrated by, but is not intended to be limited to, the following examples wherein parts are parts by weights unless otherwise indicated.

EXAMPLE 1

A patterned positive resist mask was formed on the surface of a clean silicon semiconductor wafer. The resist composition was a mixture of a phenolformaldehyde novolac resin and the 2-diazo-1-oxo-napthalene-5 sulfonic acid ester of dihydroxybenzophenone. The resist was spin coated at 1000 rpm onto the wafer surface to a dry thickness of about 2 microns, baked at from about 70°-90° C. for about 15-30 minutes, patternwise exposed to actinic radiation and then developed with a aqueous alkaline developer solution to remove the exposed portions. The resist mask and wafer are then placed in a vacuum of about $10^{-1}$ torr. and aluminum is evaporated thereon to a thickness of about 600 Å. The resultant porous layer consists primarily of $Al_2O_3$ due to the $O_2$ present at this pressure. The resist mask and wafer was removed from the vacuum system and baked at 230° C. for about 30 minutes. It was then placed in a 1:7 water buffered HF solution for one minute to etch the $AlO_3$ layer. The clean resist mask exhibited no detectable flow and therefore no image size or profile shape change during initial heating or during subsequent heating at 230° C. after the $Al_2O_3$ layer removal.

A second silicon wafer sample coated with the same photoresist baked, exposed and developed in the same manner as the first sample, but not coated with $Al_2O_3$ after development, exhibited excessive flow during baking at 230° C. to the point where the resist image was greatly distorted.

EXAMPLE 2

A patterned positive resist mask was formed on the surface of a silicon semiconductor wafer having a surface coating of an silicon oxide, by the procedure described in Example 1. The same resist as in Example 1, was used at a thickness of about 1 micrometer. The patterned wafer was placed in a vacuum at a pressure of about $2 \times 10^{-1}$ torr. and aluminum was evaporated thereon at a thickness of about 600 Å. Subsequently, the sample was baked at about 230° C. for 30 minutes, the $Al_2O_3$ layer was removed in buffered HF and the sample rebaked at 230° C. for 30 minutes. Scanning electron micrographs of the resist pattern profile showed absolutely no flow when compared to unbaked resist images of a similar sample. In contrast a similar processed sample which was baked at 230° C. for 30 minutes, but without the $Al_2O_3$ coating treatment exhibited severe resist flow.

EXAMPLE 3

A patterned positive resist mask is formed on a silicon wafer surface in accordance to the procedure described in Example 1. The same resist was again used at a thickness of about 2 μm. The patterned wafer was placed in a vacuum at $10^{-1}$ torr. and silicon was evaporated from a tungsten heated source forming a silicon oxide layer over the resist approximately 600-800 Å thick. The silicon wafer sample was then heated in an oven at 230° C. for 30 minutes. The silicon oxide layer over the resist was then removed in etching a 1:7 buffered HF wafer solution and the sample rebaked at 230° C. for 30 minutes. Scanning electron micrographs of the resist pattern showed no resist flow while a similar sample baked without prior deposition of the silicon oxide layer exhibited severe resist flow.

EXAMPLE 4

A patterned negative resist mask was formed on the surface of a clean silicon semiconductor wafer. The resist film consisted of a partially cyclized poly-cis-isoprene polymer containing a sensitizer compound, 2,6-bis-(p-azido-benzylidene)-4-methylcyclohexane spin-coated to a thickness of approximately 1.5 μm, baked at about 60° C. for 10 minutes, exposed to actinic radiation through a patterned mask, and developed in a suitable solvent to remove the unexposed parts of the resist. The sample was then placed in the vacuum at $10^{-1}$ torr. and aluminum was evaporated, as in Example 1, to a thickness of about 600 Å. The sample was subsequently heated in an oven at 200° C. for 30 minutes and the $Al_2O_3$ layer was etched away in a 1:7 buffered HF in water solution. Scanning electron micrographs of this sample showed no resist flow while a similar sample baked at 200° C. without prior coating of $Al_2O_3$ exhibited severe resist flow.

EXAMPLE 5

A patterned resist mask was formed on a silicon semiconductor wafer surface in accordance to the procedure described in Example 1. The same resist was again used as in Example 1, at a thickness of about 1.5 μm. The patterned wafer was placed in a vacuum at $10^{-1}$ torr. and silver (Ag) was evaporated from a tungsten source to a thickness of approximately 600 Å. The silicon wafer sample was then heated in an oven to a temperature of 230° C. for 30 minutes. The silver layer over the resist pattern was then etched in a 1:4 nitric acid in wafer solution for 2 minutes and the sample rebaked at 230° C. for 30 minutes. Scanning electron micrographs of the resist pattern showed no flow while a similar sample baked at 230° C. without prior silver evaporation exhibited severe pattern flow.

The foregoing has described a resist mask hardening process which prevents flow of the resist mask pattern upon heating of the film and preserves the pattern and resist profile fidelity.

Having thus described our invention, what we claim as new, and desire to secure by Letters Patent is:

1. A process for forming a flow resistant organic polymer resist mask on a substrate comprising the steps of;

evaporating a porous film of material selected from a metal or an insulator selected from the group consisting of Al, $Al_2O_3$, Cr, Ag, Si, SiO and $SiO_2$, onto the surface of said resist mask, heating the filmed resist mask to cause the hardening of said resist mask, and then removing the metal or insulator.

2. A process according to claim 1 wherein said metal or insulator is evaporated at a pressure of from about $10^{-2}$ torr. to about 1 torr.

3. A process according to claim 1 wherein said metal or insulator is evaporated to a film thickness of from about 200 Å to about 1000 Å.

4. The process of claim 1 wherein said evaporated film is $Al_2O_3$.

5. The process of claim 1 wherein said evaporated film is Cr.

6. The process of claim 1 wherein said evaporated film is Ag.

7. The process of claim 1 wherein said evaporated film is Si.

8. The process of claim 1 wherein said evaporated film is SiO.

9. The process of claim 1 wherein said evaporated films is $SiO_2$.

10. The process of claim 1 wherein said resist mask is formed from a positive acting resist composition.

11. The process of claim 1 wherein said resist mask is formed from a negative acting resist composition.

* * * * *